United States Patent [19]

Kazecki et al.

[11] Patent Number: 4,922,209

[45] Date of Patent: May 1, 1990

[54] CLOCK RECOVERY DEVICE

[75] Inventors: Henry L. Kazecki, Des Plaines; Steven H. Goode, Palatine, both of Ill.

[73] Assignee: Motorola, Inc., Schaumburg, Ill.

[21] Appl. No.: 345,135

[22] Filed: Apr. 28, 1989

[51] Int. Cl.$^5$ .............................................. H03L 7/08
[52] U.S. Cl. ...................................... 331/12; 331/23; 331/25
[58] Field of Search ....................... 331/10, 11, 12, 23, 331/25; 329/302, 306, 307, 308; 375/97, 120

[56] References Cited

U.S. PATENT DOCUMENTS 4,549,142  10/1985  Yoshida ............................. 331/12 X Primary Examiner—David Mis
Attorney, Agent, or Firm—Steven G. Parmelee

[57] ABSTRACT

A clock recovery device suitable for implementation in a DSP functions to correct a signal that includes the clock information for carrier frequency offsets, prior to extraction of the clock signal.

10 Claims, 1 Drawing Sheet

CLOCK RECOVERY DEVICE

TECHNICAL FIELD

This invention relates generally to recovery of binary encoded signals, and particularly to recovery of clock signal information included therewith.

BACKGROUND ART

The transmission of angle modulated carrier signals having substantially constant amplitude and continuous phase (such as FSK, MSK, and GMSK signals), and of similar signals having nonconstant amplitudes, to convey binary data over a radio frequency communication resource is well understood in the art. Such binary signals are typically detected through use of coherent signal detectors that use the phase of the signalling tones to facilitate detection of the transmitted bits. This type of receiver usually includes two parts; a first portion that extracts the bit clock and phase of the signalling tones, and a detector that uses the extracted signal phase.

Digital signal processors (DSPs) are also known in the art, and provide a number of significant advantages in radio design. A need exists, however, for a satisfactory clock recovery device for use with binary data transmissions that is suitable for implementation in a DSP embodiment.

SUMMARY OF THE INVENTION

These are substantially met through provision of the clock recovery device disclosed herein. This device functons generally to recover a clock signal from an information signal that includes both an in-phase and quadrature components. The clock signal itself, prior to recovery, will usually be offset at least in part by an offset that is related to the carrier frequency for the information signal.

The clock recovery device includes generally an input unit for receiving the information signal, a clock extraction unit, and a frequency correction unit. The clock extraction unit receives a signal that includes a corrected clock component and thereafter extracts and provides the recovered clock signal. The frequency correction unit receives both the signal provided by the input unit and the clock signal as provided by the clock extraction unit, and removes the error offset from the clock signal to provide the corrected clock component.

BEST MODE FOR CARRYING OUT THE INVENTION

U.S. Ser. No. 344,733, filed on even date herewith by the inventors hereof and entitled DSP Based GMSK Coherent Detector, is incorporated herein by this reference. This reference described a device for receiving a binary data transmission, down converting this signal in quadrature, and digitizing the resultant quadrature signals prior to provision of the digitized in-phase and quadrature components to a DSP. That reference then further describes the operation of the DSP to recover the binary data signals using, in part, a recovered clock signal. Disclosed herein is a description of a clock recovery device that may be implemented in that same DSP and that serves to provide the clock signal used therein.

Figure 1:
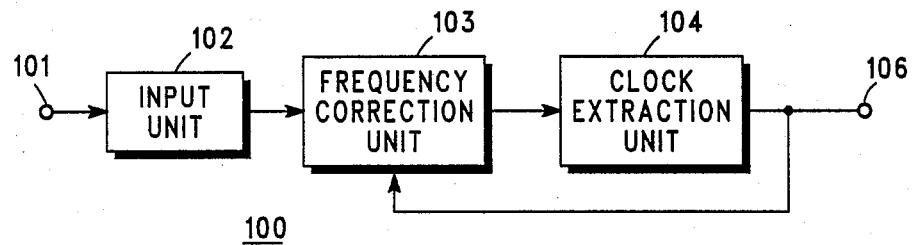
FIG. 1 comprises a block diagram depiction of the invention.

With reference to FIG. 1, the invention can be seen as depicted generally by the numeral 100. This invention (100) includes an input (101) for receiving in-phase and quadrature components of an input information signal. (In this embodiment, it will be presumed that the information signal comprises a received, continuous phase signal that includes binary data and that has been down converted in quadrature baseband.) These signals are provided to an input unit (102) that functions to process the incoming signals by an appropriate factor; in this embodiment, the incoming signals are squared.

The resultant output from the input unit (102) couples to a frequency correction unit (103) that processes both the signal provided by the input unit (102) and a recovered clock signal as fed back to it to thereby provide a signal having a corrected clock component. The latter signal is provided to a clock extraction unit (104) that recovers the clock signal and provides it at an output thereof (106).

Figure 2:
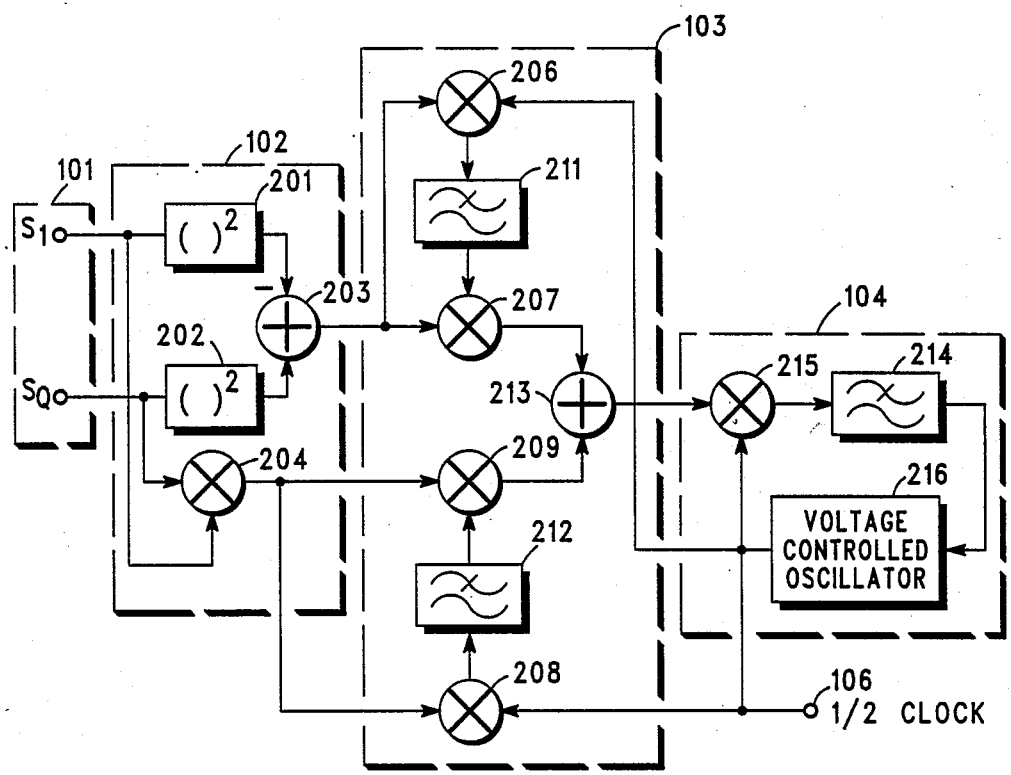
FIG. 2 comprises a diagrammatic depiction of the invention.

Referring now to FIG. 2, the input port (101) receives both an in-phase component ($S_I$) and a quadrature component ($S_Q$) of the information signal. Both components are squared (201 and 202) with the resultant signals being summed in a differential summer (203). In addition, both the in-phase and quadrature components are mixed in a multiplier (204) to yield a resultant product signal.

The resultant summed and product signals are provided to the frequency correction unit (103). In particular, the summed signal is provided to a first and second mixer (206 and 207), and the product signals are provided to a third and fourth mixer (208 and 209). The outputs of the first and third mixers (206 and 208) are coupled to appropriate lowpass filters (211 and 212), with the resultant filtered outputs being provided to the remaining inputs of the second and fourth mixers (207 and 209).

The resultant output from the second and fourth mixers (207 and 209) are provided to a summer (213), with the resultant output being provided to the clock extraction unit (104).

This summed signal is provided to a phase detector (215) that in turn couples to a lowpass filter (214) and a voltage controlled oscillator (216). The output of the VCO (216) comprises a recovered one-half clock signal. This clock signal is provided to the remaining inputs of the phase detector (215) and to the remaining inputs of the first and third mixers (206 and 208) of the frequency correction unit (103). In additon, the output of the VCO (216) comprises the recovered clock output port (106) referred to above.

Operation of the device may now be explained.

The output of the differential summer (203) of the input unit (102) comprises a signal that relates to the square of the real components of the in-phase and quadrature components of the information signal. The output of the multiplier (204) in the input unit (102) constitutes a signal that relates to the square of the imaginary components of the in-phase and quadrature components of the information signal. Presuming GMSK modulation for the original received information signal, the outputs of the differential summer (203) and multiplier (204) can be described as Sunde's FM.

These resultant real and imaginary components are then processed with respect to the clock signal to correct these signals for their inherent coherent carrier offset. After summing (213), the resultant signal includes the clock signal as substantially corrected for this error offset.

The phase lock loop (functioning here as a bandpass filter) of the clock extraction unit (104) then functions to lock to the clock, and provide the resultant recovered one-half clock signal that can be used to further extract the binary information in the information signal as described in the reference incorporated herein.

What is claimed is:

1. A clock recovery device for recovering a clock signal from an information signal having in-phase and quadrature components, wherein the clock signal is offset at least in part by an error offset related at least in part to a carrier frequency for the information signal, comprising:
    (A) input means for receiving the information signal;
    (B) clock extraction means for receiving a signal having a corrected clock component and providing the clock signal in response thereto; and
    (C) frequency correction means coupled:
        to the input means for receiving an input signal at least related to the information signal; and
        to the clock extraction means for receiving the clock signal;
        for substantially removing the error offset from the clock signal in response thereto and providing the signal having a corrected clock component.

2. The clock recovery device of claim 1 wherein the input means includes squaring means for squaring the information signal.

3. The clock recovery device of claim 1 wherein the clock extraction means includes phase detector means for receiving the signal having a corrected clock component and the clock signal and providing a phase detection output signal in response thereto.

4. The clock recovery device of claim 3 wherein the clock extraction means further includes oscillator means responsive to the phase detection output signal for providing the clock signal.

5. The clock recovery device of claim 4 wherein the clock extraction means further includes filter means for filtering the phase detection output signal and providing a filtered phase detection output signal to the oscillator means.

6. The clock recovery device of claim 1 wherein the frequency correction means includes first mixer means for mixing.

7. The clock recovery device of claim 6 wherein the frequency correction means further includes second mixer means for mixing the input signal with the offset correction signal to provide a signal having an at least partially corrected clock component.

8. The clock recovery device of claim 1 wherein the input signal includes an in-phase component and a quadrature component, and wherein the frequency correction means includes first mixer means for:
    mixing the in-phase component of the input signal with the clock signal to provide an in-phase component offset correction signal; and
    mixing the quadrature component of the input signal with the clock signal to provide a quadrature component offset correction signal.

9. The clock recovery device of claim 8 wherein the frequency correction means further includes second mixer means for:
    mixing the in-phase component of the input signal with the in-phase component offset correction signal to provide a signal having an at least partially corrected in-phase clock component; and
    mixing the quadrature component of the input signal with the quadrature component offset correction signal to provide a signal having an at least partially corrected quadrature clock component.

10. The clock recovery device of claim 9 wherein the frequency correction means further includes summing means for summing the signal having an at least partially corrected in-phase clock component with the signal having an at least partially corrected quadrature clock component to provide the signal having a corrected clock component.

* * * * *